United States Patent

Kunioka et al.

[11] Patent Number: 5,304,072
[45] Date of Patent: Apr. 19, 1994

[54] SOCKET FOR ELECTRIC PART

[75] Inventors: Shuuji Kunioka, Yokohama; Hideki Sagano, Kawasaki; Kazumi Uratsuji, Tokyo, all of Japan

[73] Assignee: Yamaichi Electronics Co., Ltd., Tokyo, Japan

[21] Appl. No.: 961,313

[22] Filed: Oct. 15, 1992

[30] Foreign Application Priority Data

Oct. 15, 1991 [JP] Japan ................................ 3-296337

[51] Int. Cl.⁵ ........................................ H01R 13/635
[52] U.S. Cl. ................................... 439/266; 439/331
[58] Field of Search .................................. 439/68–73, 439/259–270, 330, 331

[56] References Cited

U.S. PATENT DOCUMENTS

| | | | |
|---|---|---|---|
| 4,498,047 | 2/1985 | Hexamer et al. | 439/260 |
| 4,623,208 | 11/1986 | Kerul et al. | 439/266 |
| 4,691,975 | 9/1987 | Fukunaga et al. | 439/266 |
| 4,886,470 | 12/1989 | Billman et al. | 439/266 |
| 4,993,955 | 2/1991 | Savant | 439/73 |
| 5,009,609 | 4/1991 | Matsuoka et al. | 439/266 |
| 5,020,998 | 6/1991 | Ikeya et al. | 439/266 |

*Primary Examiner*—Gary F. Paumen
*Assistant Examiner*—Hien D. Vu
*Attorney, Agent, or Firm*—Wenderoth, Lind & Ponack

[57] ABSTRACT

To shift contacts of a socket for an electric part rearwardly, there is provided a slider for sliding the contacts. The slider is slid in the same direction that it moves the contacts. The slider and the contacts are engaged with each other in such a manner as to cooperatively act such that the contacts are shifted rearwardly by sliding the slider rearwardly.

5 Claims, 5 Drawing Sheets

5,304,072

SOCKET FOR ELECTRIC PART

BACKGROUND OF THE INVENTION

1. Field of the Invention

This invention relates to a socket for an electric part, in which contacts are shifted to a contact release position by sliding a slider rearwardly, so that an electric part such as an IC can be inserted and removed under a no-load condition.

2. Prior Art

U.S. Pat. No. 4,623,208 discloses a socket of the same type as the present invention, including a plurality of contacts implanted in a base, the contacts each having a curved spring portion, a contact nose portion extending forwardly from an upper end of the curved spring portion, and a cantilevered arm integrally extending rearwardly from an upper end of the curved spring portion. The curved spring portion is compressed by pushing down an end portion of the cantilevered arm so that the contact nose portion is separated away from a corresponding lead of an electric part.

Specifically, when the cantilevered arm is pushed down in the above socket, a push-down force is applied to the upper end of the curved spring portion. Since the upper end of the curved spring portion is flexed downwardly against the elasticity thereof by the push-down forced, the contact nose portion is shifted rearwardly so as to be separated away from the corresponding lead in order to facilitate smooth insertion and removal of an IC.

In the above-mentioned prior art, if a spring constant of the curved spring portion is arranged to be large in order to increase a contacting pressure, the push-down force becomes correspondingly large. In contrast, if the spring constant of the curved spring portion is arranged to be small in order to reduce an operating force, the contacting pressure is also lowered. Thus, the prior art alternatives have mutually incompatible problems as discussed. Accordingly, it is conventionally difficult to provide a design for which both the necessary operating force is arranged to be as small and the contacting pressure is large.

Furthermore, in a construction wherein the contact nose portion is shifted rearwardly by compressing the curved spring portion by pushing down the cantilevered arm, the problem occurs that it is difficult to obtain an efficient shifting amount relative to a pushing-down amount.

It further has the problem that when the cantilevered arm is pushed down, a twist tends to occur to the axis of the contact. As a result, a harmful swaying is likely to occur to the contact nose portion, and repeated application of an external force to the cantilevered arm in the curved direction easily accumulates metal fatigue to a basal portion of the cantilevered arm.

SUMMARY OF THE PRESENT INVENTION

It is therefore an object of the present invention to provide a socket for an electric part, in which a contact nose portion can be efficiently separated from a corresponding lead with a reduced operating force by sliding a slider forwardly and rearwardly, and without using a cantilevered arm integral with the contact as in the prior art.

It is another object of the present invention to provide a socket for an electric part, in which a contact nose portion can be separated rearwardly from a corresponding lead merely by applying a rearward tensile force to a spring portion of the contact, and without applying a compressing force from above to the spring portion of the contact.

A further object of the present invention is to provide a socket for an electric part, in which problems such as twisting of a contact as a result of a pushing-down operation of a cantilevered arm and metal fatigue of the cantilevered arm, as are present in the prior art, can be eliminated, and wherein the contact can be shifted without any trouble even if it is used repeatedly.

To achieve the above objects, there is essentially provided a socket for an electric part including a plurality of contacts implanted in a base, the contacts each having a spring portion and a contact nose portion extending from the spring portion, and the contact nose portion being separated from a corresponding lead of the electric part placed on the base when the contact nose portion is shifted rearwardly against the elasticity of the spring portion and press-contacted to the lead when the contact nose portion is shifted forwardly due to a restoring force of the spring portion. The socket further included a slider, slidable forwardly and rearwardly in a constant reciprocal stroke for shifting the contact nose portion, is guide means mounted on the base and adapted to guide the sliding stroke of the slider, the slider and each contact are engaged in such a manner as to cooperatively act with each other. The slider, when sliding rearwardly, displaces the contact nose portion rearwardly so that the contact nose portion is separated from the lead. The slider is slid forwardly following the forward displacement of the contact nose portion when the contact nose portion is shifted forwardly, in order to obtain a press-contact against the lead.

According to the present invention, the contact nose portion can be efficiently shifted rearwardly so as to be separated from the lead with a reduced operating force by a sliding movement of the slider in the forward and rearwardly direction, and without using a cantilevered arm as in the prior art.

The contact nose portion can be shifted rearwardly so as to be properly separated from the lead merely by applying a tensile force to the contact nose portion by sliding the slider rearwardly, and without compressing the spring portion of the contact from above by a pushing-down force.

Furthermore, a contact is not twisted as a result of the pushing-down operation of a cantilevered arm, and the cantilevered arm does not suffer from metal fatigue, as in the prior art, and the contact can be shifted without any trouble even if it is used repeatedly.

DETAILED DESCRIPTION OF THE EMBODIMENTS

Figure 1:
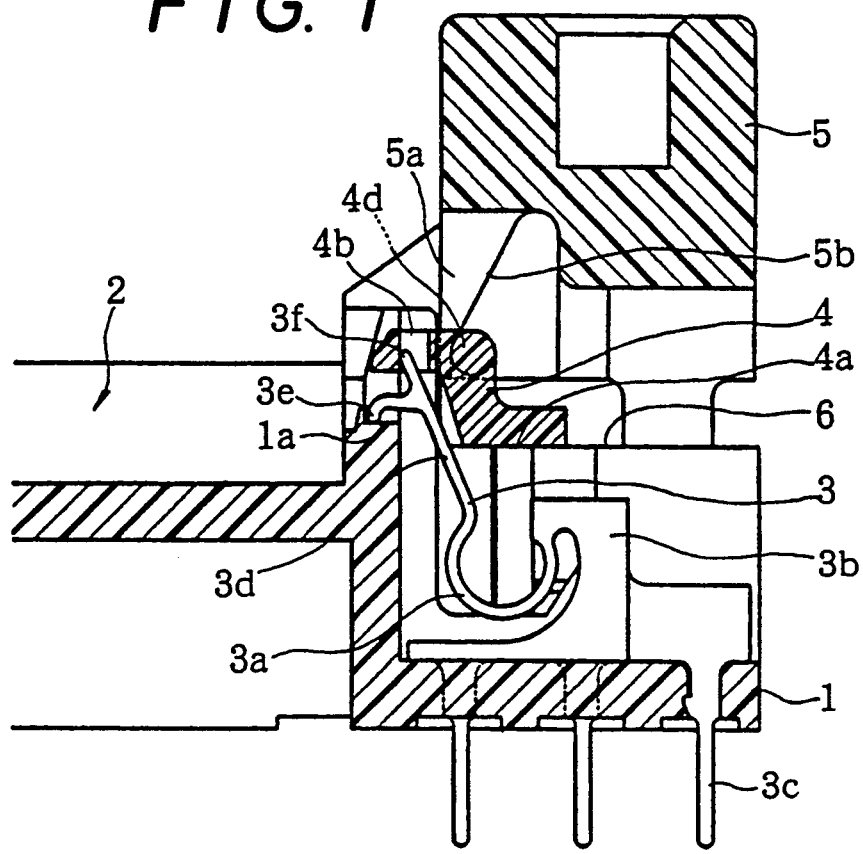
FIG. 1 is a partial sectional view, of a socket for an electric part according to a first embodiment of the present invention, in which a contact is shifted forwardly.
Figure 2:
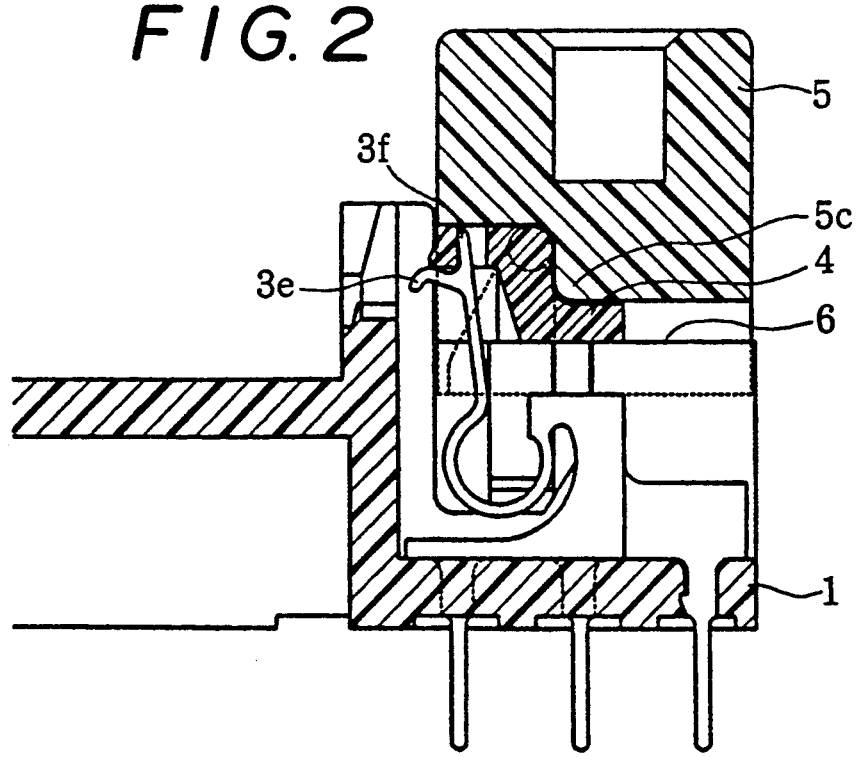
FIG. 2 is a partial sectional view, of the above socket, but in which the contact is shifted rearwardly.
Figure 3:
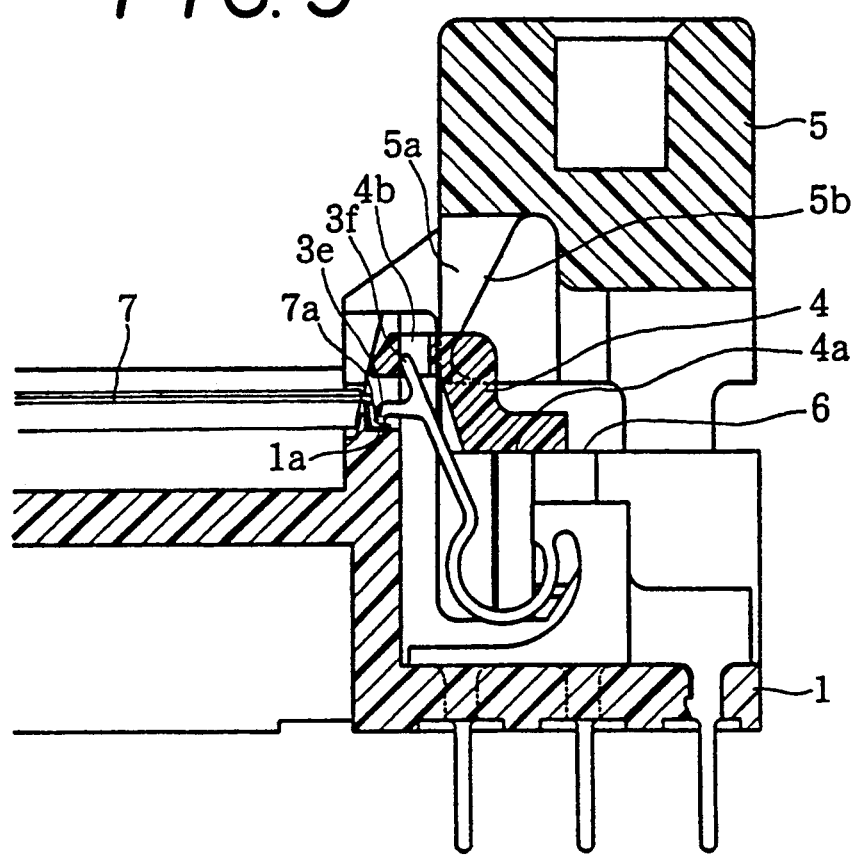
FIG. 3 is a partial sectional view of the above socket, but in which the contact is shifted forwardly to press against a lead.
Figure 4:
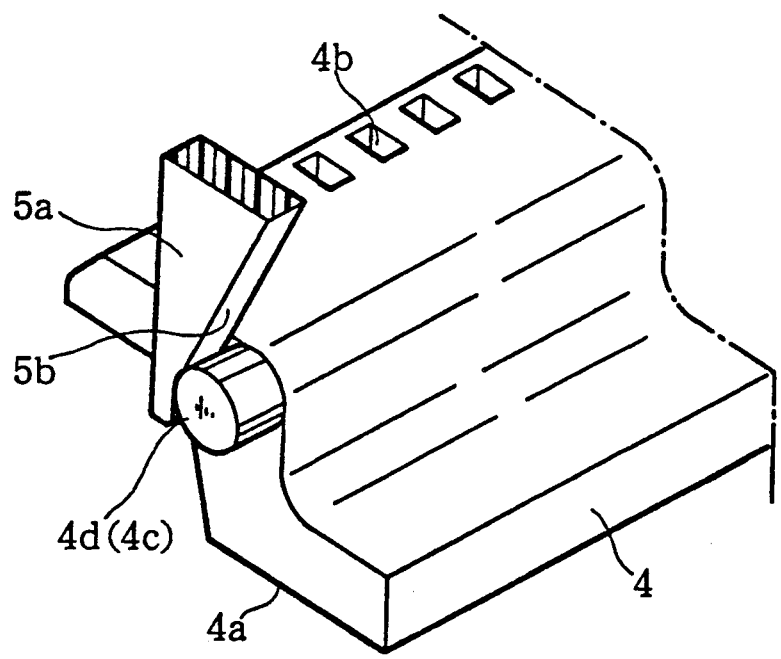
FIG. 4 is an enlarged perspective view of a slider used in the above socket.

The embodiments of the present invention will now be described with reference to FIGS. 1 through 9 inclusive. FIGS. 1 through 4 inclusive show a first embodiment of the present invention, and FIGS. 5 through 9 inclusive show a second embodiment of the present invention. Since a socket shown in FIGS. 1 through 3 is of symmetrical structure, a part of it is omitted. First, a structure common to the first and second embodiments will be described, and then characteristic structures of the first and second embodiments will be described.

Figure 7:
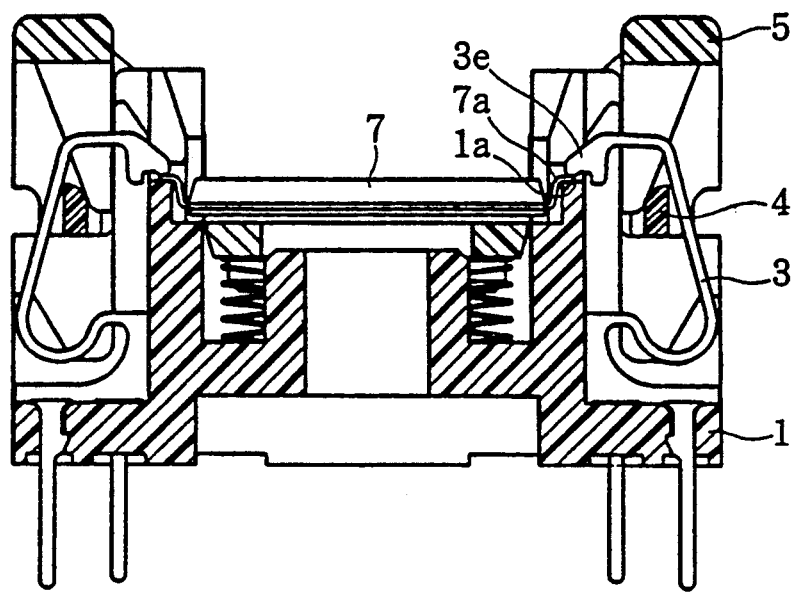
FIG. 7 is a sectional view of the above socket, but in which the contact is shifted forwardly to press against a lead.

A base 1 formed of an insulating material has a central opening which is opened at its top and bottom. An electric part accommodation space 2 is defined in the top side of the central opening and, as shown in FIGS. 3 and 7, accommodates a main body of an electric part 7 supported along a predetermined plane, and a plurality of contacts 3 are arranged in array along at least two opposing sides of the accommodation space 2 (i.e. along a peripheral portion of the base 1 disposed outwardly of the central opening).

The contacts 3 are implanted in the base 1 and each has a male terminal 3c projecting downward from a lower surface of the base 1. Each contact 3 has a flat (or base) portion 3b merged into a basal portion of the mail terminal 3c. The flat portion 3b is supported by an upper surface of a contact implanting wall in such a manner that it can be raised in a vertical direction therefrom. The contact 3 further has a curved spring portion 3a extending from the flat portion 3b. A convex curvature of the curved spring portion 3a faces downward.

In the first embodiment shown in FIGS. 1 through 4 inclusive, the curved spring portion 3a is situated ahead of its basal portion, and in the second embodiment shown in FIGS. 5 through 9 inclusive, the curved spring portion 3 is situated behind its basal portion.

A contact nose portion 3e extends forwardly from a free end side of the curved spring portion 3a. For example, an arm 3d extends forwardly and upwardly at angles from an end portion of the curved spring portion 3a, and the contact nose portion 3e extends from the free end of the arm 3d. It may be designed such that the arm 3d constitutes a second spring portion and the curved spring portion 3a constitutes a first spring portion. It may also be designed such that the arm 3d is formed of a rigid body and the rigid arm 3d is shifted by the curved spring portion 3a.

As shown in FIGS. 1 and 7, the curved spring portion 3a serves as a means for urging the contact nose portion 3e forwardly so that the contract nose portion 3e is press-contacted against an upper surface of a lead 7a of an electric part 7. By shifting the contact nose portion 3e rearwardly against the elasticity of the spring portion 3a, the contact nose portion can be separated away from the lead 7a in order to remove the contact relation.

The socket includes a slider 4 formed of an insulating material as a means for shifting the contact nose portion 3e of the contact 3 rearwardly against the elasticity of the spring portion 3a. The slider 4 extends in parallel relation with a row of the contacts 3 and can be slid forwardly and rearwardly at a constant reciprocal stroke. In other words, the slider 4 can be slid in the same direction as the shifting direction of the contact member, and the slider 4 and the contacts 3 can be engaged in such a manner as to cooperatively act with each other.

The base 1 is provided with a guide means for guiding the slider 4. As one example of the guide means, as shown for example in FIG. 1 or 5, a guide surface 6 formed of a flat plane extending behind the arm 3d is formed at an upper location of the spring portion 3a. On the other hand, a sliding surface 4a formed of a flat plane is formed on a lower surface of the slider 4. The slider 4 is supported on the guide surface 6 by the sliding surface 4a, so that the slider 4 can be slid forwardly and rearwardly along the guide surface 6.

As a preferred example of the guide surface 6, the guide surface 6 is formed of a horizontal plane. Specifically, it includes, as a means for sliding the slider 4 laterally, a cover 5 which is disposed at an upper part of the base 1 in such a manner as to be able to move upwardly and downwardly in the vertical direction, the guide surface 6 being perpendicular to the moving direction (i.e. horizontal) of the cover 5. The arrangement being such that the slider 4 can be slid along the guide surface 6 in a perpendicular direction with respect to the moving direction of the cover 5.

As another example for sliding the slider 4 in the lateral direction, it may be designed such that the slider 4 is slid rearwardly along either a downward inclination or an upward inclination. Although not shown, at this time, the guide surface 6 may be of a flat surface of a curved surface having a certain angle of inclination.

The cover 5 has a cam means for sliding the slider 4 in the lateral direction in accordance with its upward and downward (vertical direction) movement. The cam means is formed of a cam element 5a projecting downward from the cover 5. The cam element 5a has an inclined cam face 5b at its rear side surface, while the slider 4 has a pressure bearing portion 4c slide-contacted with the inclined cam face 5b.

The pressure bearing portion 4c will now be described. In the first embodiment shown in FIGS. 1 through 4 inclusive, as apparent from FIG. 4, the slider 4 is provided with slide-engaging elements 4d projecting from each opposing ends thereof, and the cam element 5a is contacted at its inclined surface 5b with a front side surface of the slide-engaging element 4d.

Figure 8:
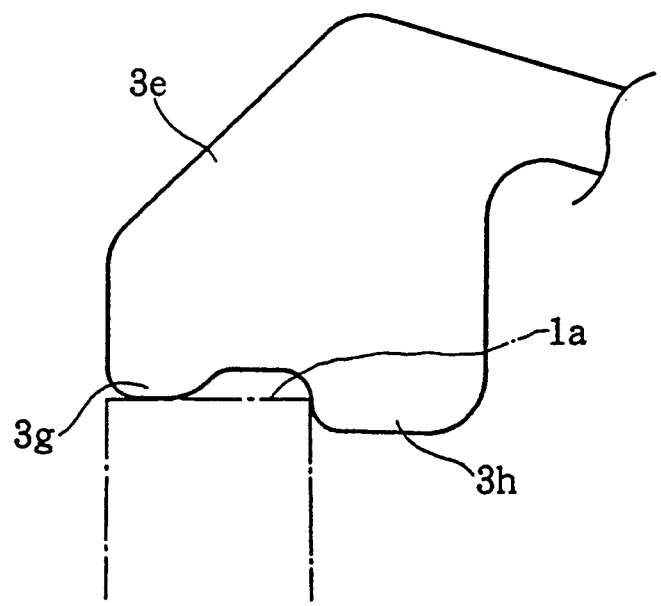
FIG. 8 is an enlarged side view of a contact nose portion of a contact used in the socket of the second embodiment.
Figure 9:
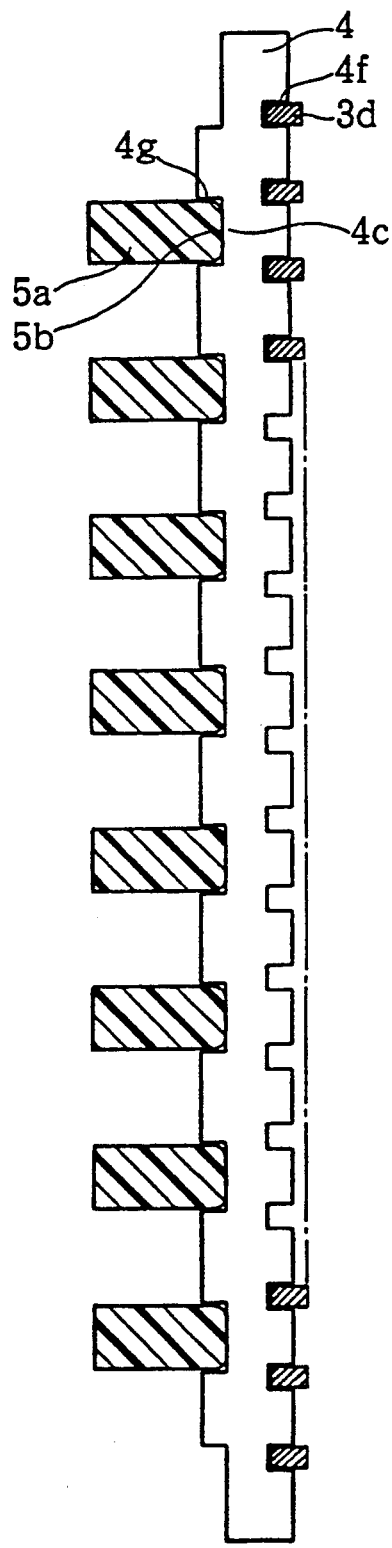
FIG. 9 is a plan view of a slider used in the socket of the second embodiment.

In the second embodiment shown in FIGS. 5 through 9 inclusive, as apparent from FIG. 9, the slider 4 is provided with a plurality of recessed portions 4g formed in a front edge portion thereof, and the recessed portions 4g are arranged at equal spaces in the longitudinal direction. On the other hand, the cover 5 is provided with a number of cam elements 5a corresponding to the recessed portions 4b. The cam elements 5a are slide-fitted into the corresponding recessed portions 4g, and the inclined cam faces 5b are contacted with inner walls of the recessed portions 4g, respectively, thereby forming the pressure bearing portions 4c, respectively.

The cam element 5a, when vertically lowered by the pushing-down operation of the cover 5, is slid down at its inclined cam face 5b the pressure bearing portion 4c and pushes the pressure bearing portion 4c rearwardly in order to slide the slider 4 rearwardly against the elasticity of the spring portion 3a of the contact 3. On the contrary, when the slider 4 is slid forwardly by a forward restoring force of the spring portion 3a of the contact 3, the pressure bearing portion 4c presses the inclined cam face 5b to restore the cover 5 upwardly. In other words, the cam element 5a acts as a means for converting the upward and downward motion of the cover 5 to the lateral motion of the slider 4. As a preferred example, the cam element 5a acts as a means for converting the vertical motion of the cover 5 to a horizontal direction of the slider 4.

The slider 4 and the contacts 3 are engaged in such a manner as to cooperatively act with each other as mentioned. The engaging means will now be described. In the first embodiment shown in FIGS. 1 through 4 inclusive, as apparent from FIG. 4, the slider 4 is provided at its front end portion with a plurality of engaging holes 4b or grooves arranged in the direction of the row of contacts 3 and vertically defined all the way through the slider 4. A free end of each contact 3 is provided with a head engaging element 3f (also referred to as the end of the spring portion opposite the end thereof fixed to the base portion of the contact) projecting upward of the contact nose portion 3e, and the head engaging element 3f is inserted into the engaging hole 4b or groove. Then, as shown in FIG. 1, the head engaging element 3f is inserted into the engaging hole 4b or groove. As shown in FIG. 1, the head engaging element 3f is pushed against the front inner side surface of the engaging hole 4b or groove by elasticity of the spring portion 3a.

In the first embodiment, the slider 5 is designed to be high at its front end and low at its rear end in order to form a step portion, and the position where a step portion 5c of the cover 5 is engaged with the step portion serves as a lower limit for the downward movement of the cover 5. In the embodiments shown in FIGS. 1 through 9 inclusive, as apparent from FIG. 9 and others, the slider 4 is provided at a rear edge portion thereof with a plurality of recessed portions 4f, and the recessed portions 4f are arranged at equal spaces in the longitudinal direction (i.e., direction of the row of contacts 3) of the slider 4. The arms 3d of the contacts 3 are engaged in the recessed portions 4f, respectively, so that the arms 3d are press-contacted with the inner walls of the recessed portions 4f by elasticity of the spring portions 3a, respectively.

The recessed portions 4f and the recessed portions 4g are arranged in such a manner as to shift their pitches with each other, so that the cam elements 5a press the areas between the adjacent recessed portions 4f (namely, between the adjacent contacts 3), respectively. Owing to the constructions shown in the first and second embodiments, the contacts 3 urge the slider 4 to be slid forwardly.

Figure 6:
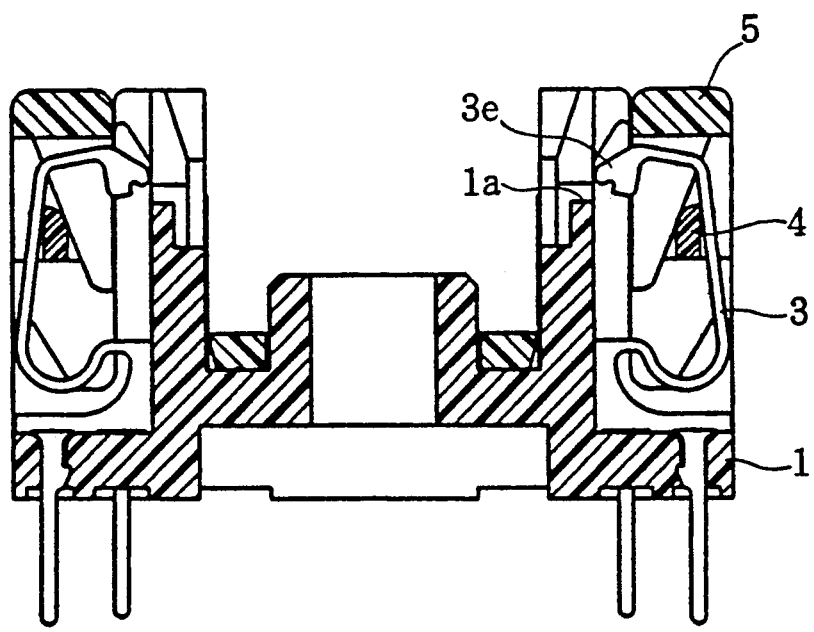
FIG. 6 is a sectional view of the above socket, but in which the contact is shifted rearwardly.

As shown in FIGS. 2 and 6, when the slider 4 is slid rearwardly the contact nose portion 3e is shifted rearwardly against elasticity of the spring portion 3a and the slider 4 is slid forwardly by the restoring force of the spring portion 3a. Therefore, when the cover 5 is moved downward, the cam element 5a causes the contact nose portion 3e to be separated rearwardly away from the contacting position with the lead 7a to realize a non-interference state, in the same manner as it causes the slider 4 to be slid rearwardly against the spring portion 3a. In the state shown in FIGS. 2 and 6, the electric part 7 can be inserted into and removed from the accommodation space 2 under a no-load condition.

Lead supporting seats 1a are disposed at the opposing two or four sides of the accommodation space 2. When the electric part 7 is inserted into the accommodation space 2, the leads 7a projecting sideward of the electric part 7 are supported on the upper surfaces of the lead supporting seats 1a, respectively.

Next, as shown in FIGS. 3 and 7, in the state where the electric part 7 is accommodated in the accommodation space 2, when the pushing-down force against the cover 5 is removed, the slider 4 is slid forwardly by the restoring force of the spring portion 3a of the contact 3, and the pressure bearing portion 4c, in associating with the foregoing movement, urges the cam element 5a to push the cover 5 upwardly. At the same time, the contact element 3e of the contact 3 is shifted forwardly and press-contacted with the upper surface of the lead 7a which is supported on the supporting seat 1a.

Figure 5:
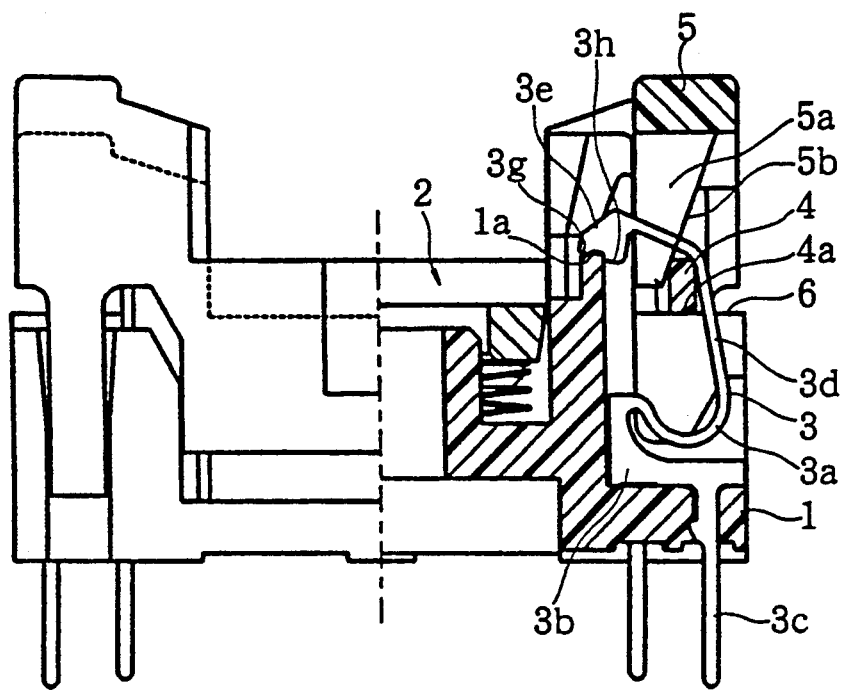
FIG. 5 is a view, half of which is in section, of a socket for an electric part according to a second embodiment of the present invention, in which a contact is shifted forwardly.

The contact nose portion 3e of the contact 3 shown in the second embodiment, as shown in FIG. 8, has a positioning projection 3h at a rear portion of another projection 3g adapted to press-contact against the upper surface of the lead 7a. A step is formed between the projections 3g and 3h. As shown in FIG. 5, when the contact nose portion 3e is shifted forwardly, the contacting projection 3g is press-contacted with the upper surface of the supporting seat 1a in the state where the elasticity is stored. At the same time, a rear edge portion of the supporting seat 1a is engaged in the step portion and the projection 3h is engaged with the outer side surface of the edge portion in order to correctly position each contact.

Although not shown, a plurality of the sliders 4 may be provided for each row of contacts 3. In other words, it may be designed such that the contacts group arranged in a row is divided into small groups, so that the small groups can be shifted by their own sliders.

According to the present invention, the intended rearward shifting of the contact can be realized by a rearward sliding movement of the slider sliding in the same direction as the contact nose portion, and therefore the contact nose portion can be efficiently separated from the contacting position with the lead with a reduced operating force.

Furthermore, the cantilevered arm for compressing the spring portion as in the prior art is no longer required. As a result, the problem arising from repeatedly pushing down the cantilevered arm integral with the contact and repeatedly compressing the curved spring portion can be eliminated efficiently.

That is, by reducing the maximum stress caused by the pushing-down operation of the cantilevered arm and the compressing operation of the curved spring portion and by reducing the metal fatigue of the cantilevered arm and curved spring portion, the service life can be prolonged. Moreover, the twisting and swaying of the contact nose portion caused by the pushing-down operation of the cantilevered arm can be effectively eliminated, and a wholesome function of the contacts can be obtained. As a result, a highly reliable contact relation can be obtained.

What is claimed is:

1. A socket for an electric part having a main body and a plurality of leads mounted to the main body, said socket comprising:
   a base having a central accommodation portion for accommodating the main body of the electric part supported along a predetermined plane, a peripheral portion disposed peripherally outwardly of said central accommodation portion in an outward direction therefrom parallel to said predetermined plane, and a seat disposed between said central accommodation portion and said peripheral portion for receiving the leads of the electric part;
   a plurality of contacts mounted to said base, each of said contacts including a spring portion and a contact nose portion extending from said spring portion, said contact nose portion being movable between an inward position in which it presses against said seat of said base and is adapted to contact a respective one of the leads of the electric part, and an outward position spaced outwardly of said inward position;
   shifting means for shifting said contact nose portions of said contacts between said inward and outward positions thereof, said shifting means comprising a slider movable in said outward direction and in an inward direction opposite said outward direction between a first position and a second position spaced outwardly of said first position;
   guide means disposed on said base for guiding said slider to move in said inward and said outward directions; and
   wherein said shifting means is operable to shift said contact nose portions inwardly from said outward positions to said inward positions when said slider moves inwardly from said second position to said first position, and to shift said contact nose portions outwardly from said inward positions to said outward positions when said slider moves outwardly from said first position to said second position.

2. A socket as recited in claim 1, wherein
   said outward positions of said contact nose portions are further spaced from said inward positions in a direction normal to said predetermined plane.

3. A socket as recited in claim 1, wherein
   said slider is engaged with a portion of each of said spring portions.

4. A socket as recited in claim 1, wherein
   each of said contacts further includes a base portion, said spring portion having a first end fixed to said base portion and a second end opposite said first end; and
   said slider is engaged with said second end of each of said spring portions.

5. A socket as recited in claim 1, further comprising
   presser means for sliding said slider in said inward and outward directions between said first and second positions, said presser means comprising a presser cover operably engaged with said base and movable in a first direction substantially normal to said predetermined plane and in a second direction opposite said first direction, said presser means being operable to slide said slider in said outward direction from said first position to said second position when said presser cover is moved in said first direction and to slide said slider in said inward direction from said second position to said first position when said presser cover is moved in said second direction.

* * * * *